United States Patent [19]

Nutz et al.

[11] 4,288,740

[45] Sep. 8, 1981

[54] CONSTANT CURRENT SWITCH

[75] Inventors: Karl-Diether Nutz, Oedheim; Helmut Moser, Heilbronn, both of Fed. Rep. of Germany

[73] Assignee: Licentia Patent-Verwaltungs-G.m.b.H., Frankfurt, Fed. Rep. of Germany

[21] Appl. No.: 71,477

[22] Filed: Aug. 31, 1979

[30] Foreign Application Priority Data

Sep. 1, 1978 [DE] Fed. Rep. of Germany ....... 2838171

[51] Int. Cl.³ .............................................. G05F 5/00
[52] U.S. Cl. .................................... 323/303; 323/349
[58] Field of Search ......................... 323/1, 4, 8, 22 T; 307/297

[56] References Cited

U.S. PATENT DOCUMENTS

| | | | |
|---|---|---|---|
| 4,020,367 | 4/1977 | Yamashiro et al. | 307/297 |
| 4,074,181 | 2/1978 | Crowle | 323/22 T |
| 4,160,944 | 7/1979 | Ahmed | 323/4 |

*Primary Examiner*—William M. Shoop
*Assistant Examiner*—Peter S. Wong
*Attorney, Agent, or Firm*—Spencer & Kaye

[57] ABSTRACT

A constant current switch for controlling a generally constant switchable load current with fluctuating voltage comprises a first transistor connected in to the current branch of the load circuit and having a voltage divider in parallel to its control path for measuring its control voltage and a second transistor connected to the control input of the switch and to the voltage divider.

4 Claims, 1 Drawing Figure

U.S. Patent    Sep. 8, 1981    4,288,740
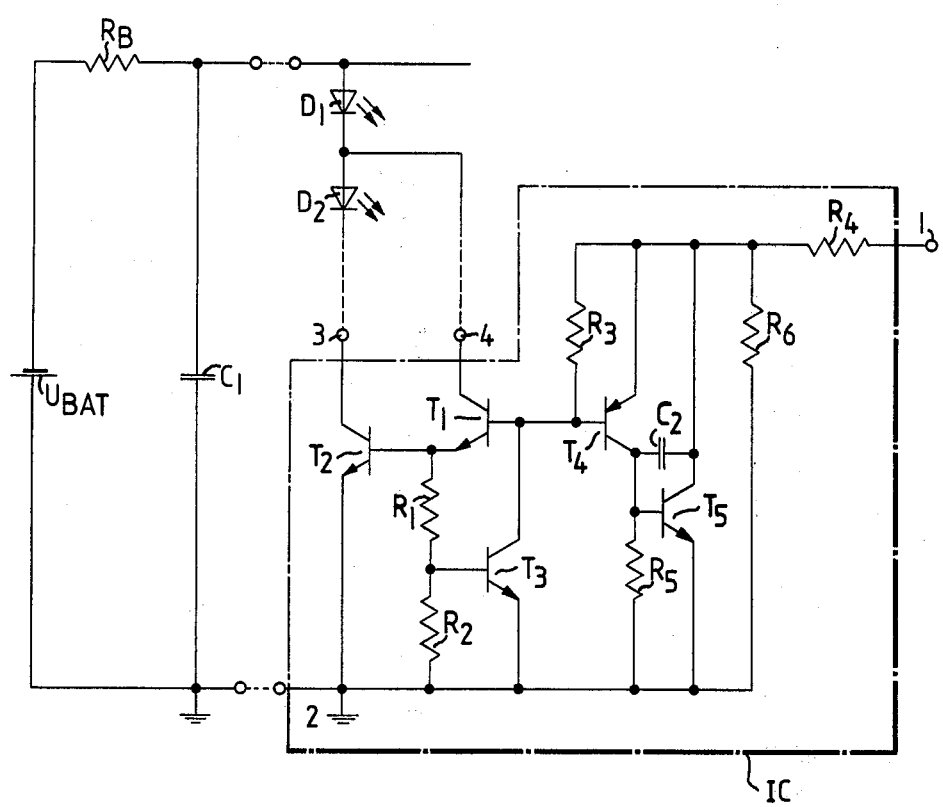

4,288,740

CONSTANT CURRENT SWITCH

BACKGROUND OF THE INVENTION

The invention relates to a constant current switch for controlling a largely constant switchable load current in the case of a fluctuating supply voltage.

For example a constant and relatively high current is required to modulate high-output infra-red diodes. Thus it is required that a constant transmission power of the infra-red diodes should be guaranteed over as large as possible a voltage range even with a fluctuating and falling supply voltage, these infra-red diodes being used in many cases for data transmission paths.

SUMMARY OF THE INVENTION

It is an object of the invention to provide a constant current switch which can be implemented in integrated semiconductor technology with as small an expenditure on components as possible and which permits a relatively large reduction in the supply voltage. Generally, the invention provides a constant current switch of the type mentioned at the outset, the connection of a first transistor into the current branch of the load current, the connection of a voltage divider for the purpose of measuring the control voltage at the first transistor in parallel with the control path of the first transistor; and the connection of a second transistor with the control input of the switch and to this voltage divider.

The transistors are preferably bipolar transistors inside an integrated semiconductor circuit in which deviations of the base-emitter voltages of the various transistors are balanced out and the transistors are coupled together thermally.

According to a first aspect of the invention, there is provided a constant current switch for controlling a generally constant switchable load current under fluctuating supply voltage comprising a first transistor connected into the current branch of the load current, a voltage divider connected in parallel with the control path of said first transistor for measuring the control voltage at said first transistor and a second transistor connected to said voltage divider and a control input of the switch.

According to a second aspect of the invention, there is provided a constant current switch for controlling a largely constant switchable load current in the case of a fluctuating supply voltage, wherein a first transistor is connected into the current branch of the load current; a voltage divider for measuring the control voltage at said first transistor is connected in parallel with the control path of the said first transistor; and a second transistor in connection with a control input of the circuit is connected to said voltage divider.

BRIEF DESCRIPTION OF THE DRAWING

The invention will now be described in greater detail by way of example with reference to the drawings, the single FIGURE of which shows one embodiment in accordance with the invention.

DESCRIPTION OF THE PREFERRED EMBODIMENT

Referring now to the drawings, the chain line shows an integrated circuit whose connection pins are provided with the numbers 1 to 4.

A transistor $T_2$ serves to take over the load current, which may amount up to 10 A with corresponding construction of this transistor. A voltage divider made up of resistors $R_1$ and $R_2$ is connected in parallel with the base-emitter path of the transistor $T_2$. The connection between these two resistors leads to the base electrode of a transistor $T_3$, the emitter of which is at the same potential as the emitter of the transistor $T_2$. In addition, a further transistor $T_1$ is connected between the collector of the transistor $T_3$ and the base of the transistor $T_2$, this transistor $T_1$ being connected by its emitter electrode to the base connection of the transistor $T_2$. The collector electrode of the transistor $T_3$ leads to the base electrode of the transistor $T_1$ while the collector electrode of the transistor $T_1$ is connected to pin 4. The collector electrode of the transistor $T_2$ leads to pin 3.

The control connection (pin 1) is connected via a constant current circuit to the base electrode of the transistor $T_1$ and to the collector electrode of the transistor $T_3$. This constant current source comprises complementary transistors $T_4$ and $T_5$, with the emitter electrode of $T_4$ and the collector electrode of $T_5$ connected to the control input via the input resistor $R_4$. The base electrode of the transistor $T_4$ is coupled to the base electrode of the transistor $T_1$. The preconduction variable resistor $R_3$ is in parallel with the base-emitter path of the transistor $T_4$. The collector of $T_4$ is connected to the base electrode of $T_5$ and to a reference potential via the collector resistor $R_5$. The emitter electrode of the transistor $T_5$ is at the reference potential.

With the above circuit, the current is controlled for example by means of infra-red diodes $D_1$ and $D_2$ which are connected one after the other and may be connected externally. These diodes serve for example to transmit signals in the case of remote control circuits. An externally connectable capacitor $C_1$ serves as a voltage source and is charged by a battery ($U_{Batt}$) via the battery series resistance $R_B$ and which may be discharged via the diode path and the transistor $T_2$.

There is the possibility of connecting together pins 3 and 4 and connecting them to the series connection of diodes $D_1$ and $D_2$. This method of connection does however have the disadvantage that the voltage source must supply at least the flow voltage of the two diodes, the saturation voltage of the transistor $T_1$ and the base-emitter voltage of the transistor $T_2$. When the actual voltage falls below this voltage, the diodes $D_1$ and $D_2$ are no longer sufficiently supplied with current. If on the other hand pin 4 is connected to the connection between the two diodes $D_1$ and $D_2$, while pin 3 is connected to the series circuit of the two diodes, then the direct voltage supply may drop to a value which is about the saturation voltage of the transistor $T_2$ via the double flow voltage of the diodes $D_1$ and $D_2$. In order to facilitate both types of connection, the connections are passed out of the integrated circuit separately to the collectors of the transistors $T_1$ and $T_2$.

The circuit as shown above function as follows:

In order to control diodes $D_1$ and $D_2$ control pulses occur at the control input (pin 1). As soon as the sum of the base-emitter voltages of transistors $T_1$ and $T_2$ applied to the base connection of transistor $T_1$ the transistor $T_2$ is driven and a high current flows through the collector-emitter path of the transistor $T_2$. As the current rises through the transistor $T_2$ the base-emitter voltage $U_{BET2}$ increases. This voltage is divided up in accordance with the divider ratio between resistors $R_1$ and $R_2$. When a defined value is exceeded the voltage drop across resistor $R_2$ is sufficient to drive the transistor $T_3$, which transistor $T_3$ now removes base current from transistor $T_2$ so that the modulation of the transistor $T_2$ is limited in this way.

The principle of the circuit is based on the different base-emitter voltages of the transistors $T_2$ and $T_3$ which are brought about by operating currents of different size. The voltage divider is designed for example so that with $U_{BET2}=1.0$ V (corresponding to $I_{E2}=2$ A) the base-emitter voltage $U_{BET3}=720$ mV (corresponding to $I_{E3}=1$ mA) which is sufficient to drive the transistor $T_3$ drops across resistor $R_2$.

The invention has the advantage that the emitter path of the transistor $T_2$ may be without resistance so that a voltage drop across the otherwise conventional resistor in the emitter path is omitted with minimum permitted direct supply voltage. The residual voltage dropping across the integrated circuit is thus extremely small and, according to the type of circuit at pin 3 and pin 4, amounts to either $U_{CE2sat}$ or $U_{BET2}+U_{CE1sat}$. Saturation of this power transistor is avoided by the current control at transistor $T_2$ so that small switching times may be achieved. The circuit is moreover largely independent of temperature.

The constant current source which is connected at the beginning ensures that, as the control voltage rises at the input pin 1, the base-emitter voltage of the transistor $T_3$ remains constant. The rated current determining this base-emitter voltage at transistor $T_3$ is produced from $I_{Nenn}=U_{BET4}/R_3$. If the input control voltage rises steeply, then the transistor $T_5$ discharges the transistor $T_4$ so that the base-emitter voltage at the transistor $T_4$ cannot vary substantially. The capacitor $C_2$ connected between the collector electrode of $T_4$ and the collector electrode of $T_5$ serves to prevent oscillation.

The resistors provided in the circuit are dimensioned for example as follows:

$R_1=2.450\Omega$
$R_2=4.850\Omega$
$R_3=560\Omega$
$R_4=2.000\Omega$
$R_5=6.200\Omega$ The resistor $R_6$ which is in parallel with the collector-emitter path of the transistor $T_5$ has a value of 100 k$\Omega$.

When using a battery with a rated voltage of 9 V this voltage may drop to a lowest value of approximately 6.2 V, if the forward voltage of the infra-red diodes $D_1$ and $D_2$ amounts to 2.7 V and the saturation voltage of the transistor $T_2$ amounts to 800 mV. The transistor $T_2$ must be designed so that it can take over a current of several amps. The transistors $T_1$, $T_2$, $T_3$ and $T_5$ are preferably NPN transistors while the transistor $T_4$ is a PNP transistor.

It will be understood that the above description of the present invention is susceptible to various modification changes and adaptation.

What is claimed is:

1. A constant current switch for controlling a largely constant switchable load current in the case of a fluctuating supply voltage subject to large decreases, comprising: a first bipolar transistor connected into the current branch of the load current; a voltage divider for measuring the control voltage at said first transistor connected in parallel with the base-emitter path of said first transistor; a second bipolar transistor in connection with a control input of the circuit and having its base electrode connected to said voltage divider; and a third bipolar transistor connected between the collector electrode of said second transistor and the base electrode of said first transistor, with the collector electrode of said second transistor connected to the base electrode of said third transistor and the emitter electrode of said third transistor connected to said voltage divider and to the base electrode of said first transistor.

2. A switch as defined in claim 1, wherein the emitter electrodes of said first and second transistors are at the same potential.

3. A switch as defined in claim 1, wherein said bipolar transistors are in an integrated semi-conductor circuit and comprising separate outputs from said integrated circuit for the collector electrodes of said first and of said third transistors to enable said collector electrodes to be connected to different points of a load current circuit.

4. A switch as defined in claim 1 and comprising a constant current source connected between said control input and said second and third transistors.

* * * * *